United States Patent

Schultz et al.

(10) Patent No.: US 6,366,410 B1
(45) Date of Patent: *Apr. 2, 2002

(54) RETICULAR OBJECTIVE FOR MICROLITHOGRAPHY-PROJECTION EXPOSURE INSTALLATIONS

(75) Inventors: Jörg Schultz, Aalen; Johannes Wangler, Königsbronn; Karl-Heinz Schuster, Königsbronn-Zang, all of (DE)

(73) Assignee: Carl-Zeiss-Stiftung (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/125,621
(22) PCT Filed: Dec. 3, 1997
(86) PCT No.: PCT/EP97/06760
§ 371 Date: Aug. 12, 1999
§ 102(e) Date: Aug. 12, 1999
(87) PCT Pub. No.: WO98/28644
PCT Pub. Date: Jul. 2, 1998

(30) Foreign Application Priority Data

Dec. 21, 1996 (DE) .......................................... 196 53 983

(51) Int. Cl.[7] .......................... G02B 3/00; G02B 21/02; G02B 17/00
(52) U.S. Cl. ........................ 359/649; 359/656; 359/726
(58) Field of Search .................................. 359/656–661, 359/649–651, 726–728, 733

(56) References Cited

U.S. PATENT DOCUMENTS 4,906,080 A 3/1990 Omata .......................... 359/708
5,982,558 A * 11/1999 Furter et al. ................. 359/649

FOREIGN PATENT DOCUMENTS

| DE | 195 48 805 A 1 | 7/1997 | ........... G02B/13/24 |
| EP | 0 564 264 A1 | 10/1993 | ............. G03F/7/20 |
| WO | WO95/32446 | 11/1995 | ........... G02B/17/08 |

OTHER PUBLICATIONS

English Language Abstract for German Patent 292 727 (1 page), dated Mar. 2, 1989.

Nomura, N. et al., "ArF Quarter–Micron Projection Lithography With An Aspherical Lens System", *Microelectronic Engineering*, Apr. 1990, vol. 11, pp. 183–186.*

* cited by examiner

Primary Examiner—Jordan M. Schwartz

(57) ABSTRACT

A REMA objective is realized by introduction of a few (1 to 5 units) aspherical surfaces of high-quality correction with a low number of lenses (no more than 10), and low path in glass (maximum 25% to 30%) of the object-reticle distance, thus enhancing efficiency.

29 Claims, 3 Drawing Sheets

RETICULAR OBJECTIVE FOR MICROLITHOGRAPHY-PROJECTION EXPOSURE INSTALLATIONS

BACKGROUND OF THE INVENTION

The invention relates to a REMA objective. This is an objective with which a Reticle Masking (REMA) device is imaged in the plane of the reticle which carries the structured mask for lithography. The region which is lighted on the reticle is thus sharply delimited. The reticle masking device is usually constructed with adjustable blades. The imaging usually gives enlargement.

A REMA objective is used in microlithography projection illumination devices (steppers or scanners).

DESCRIPTION OF RELATED ART

An illuminating device for a microlithography projection illumination device is known from DE-U-94 09 744 in it there are provided, in the following sequence: light source, shutter, coupling lens (zoom-axicon), glass rod as integrator, reticle masking system, REMA objective for imaging on the reticle the intermediate field plane located in the reticle masking system, containing a first lens group, a pupil intermediate plane, a second lens group, a deflecting prism, a third lens group, and the reticle plane with the reticle. After this there follows a projection objective, which normally reduces and which contains—for example with a non-telecentric input—an internal pupil plane, and then the wafer in the image plane.

In the system according to EP 0 526 242 A1, a projection objective is first provided after the integrator, here a honeycomb condenser, before the reticle masking system follows. The reticle masking system is optically conjugate to the reticle plane via two lens groups and a mirror, and is thus imaged. Likewise, the diaphragm at the exit of the integrator—the secondary light source—is imaged by the two lens groups and portions of the projection objective on the pupil of the projection objective. Nothing is said there about imaging errors.

A high aperture catadioptric reduction objective for microlithography is described in the Applicant's WO 95/32446; its embodiment example according to FIG. 3 and Table 2 is exactly matched by the embodiment example of a REMA objective shown here.

The Laid-Open Patent Application DE-A 195 48 805 of Dec. 27, 1995, which was first published after the priority date, describes REMA objectives with exclusively spherical lens surfaces. The embodiment example there has 13 lenses and is very similar in its optical properties to the embodiment example shown here (FIG. 1). Both REMA objectives predominantly match, as regards their pupil function, the projection objective of WO 95/32446.

U.S. Pat. No. 5,742,436 corresponding to the said WO document; U.S. Pat. No. 5,982,558 corresponding to DE-A 195 48 805; and U.S. Pat. No. 5,646,715 corresponding to DE-U 94 09 744, are therefore expressly a part of the disclosure of this patent application.

The invention has as its object to provide a REMA objective which has considerably fewer boundary surfaces, at which reflection losses occur, and a considerably smaller glass path, in which absorption takes place, and thus a substantially improved degree of transmission efficiency. This is not to lead to any curtailment of the optical properties.

A REMA objective according to this invention has a few, at most four or five, aspheric elements.

A REAM objective according to the invention has an enlargement of three times through eight times, a light-conduction value greater than 10 mm, in which imaging of a bright/dark edge from an object plane onto a reticle plane results in an edge course whose brightness values of 5% and 95% are mutually separated by less than 2% of the image field diameter, including no more than 10 lenses, including 1 to 5, aspheric surfaces.

It is known per se that aspheric elements open up new correction possibilities, and lenses can be saved thereby. However, it is also clear that aspheric elements drastically increase the cost of production and of quality testing, so that they have to be used sparingly, with due regard to their number and their deviation from a spherical shape.

A respective reduction of the number of lenses and the glass path to below 60%, with only three to four, at most five, aspheric elements, whose deviations from sphericity are moderate, has surprisingly been achieved. Furthermore, the high requirements on a REMA objective are then fulfilled, and the efficiency (the transmission) is nevertheless clearly increased.

Claim 1 makes this circumstance clear. Claim 2 is oriented to the structure, with condenser, intermediate, and field lens portions.

Dependent claims 3–15 relate to advantageous embodiment examples.

Claim 2 quantifies the reduced glass path to under 30%, preferably under 25%, of the object-reticle distance.

The REMA objective according to the invention reproduces a predetermined pupil function with values of sin(I) in the range of ±10 mrad with deviations of less than ±1 mrad, including deviations of less than ±0.3 mrad. Claims 7 and 8 then relate to conforming to the specially preferred environment with REMA at the exit of a glass rod or with a reducing catadioptric projection objective.

Claim 15 relates to the conformity to the pupil function of a projection objective with very good telecentricity with very small deviations. The small deviations from parallelism of the main beams of the projection objective are thus very well met by the REMA objective.

Independent claim 16 takes up this good conformity to the associated projection objective of the REMA objective with the described few elements, for a whole microlithography projection illumination device.

BRIEF DESCRIPTION OF THE DRAWINGS

The invention is described in more detail with reference to the accompanying drawings.

DETAILED DESCRIPTION OF THE PREFERRED EMBODIMENTS

Figure 1:
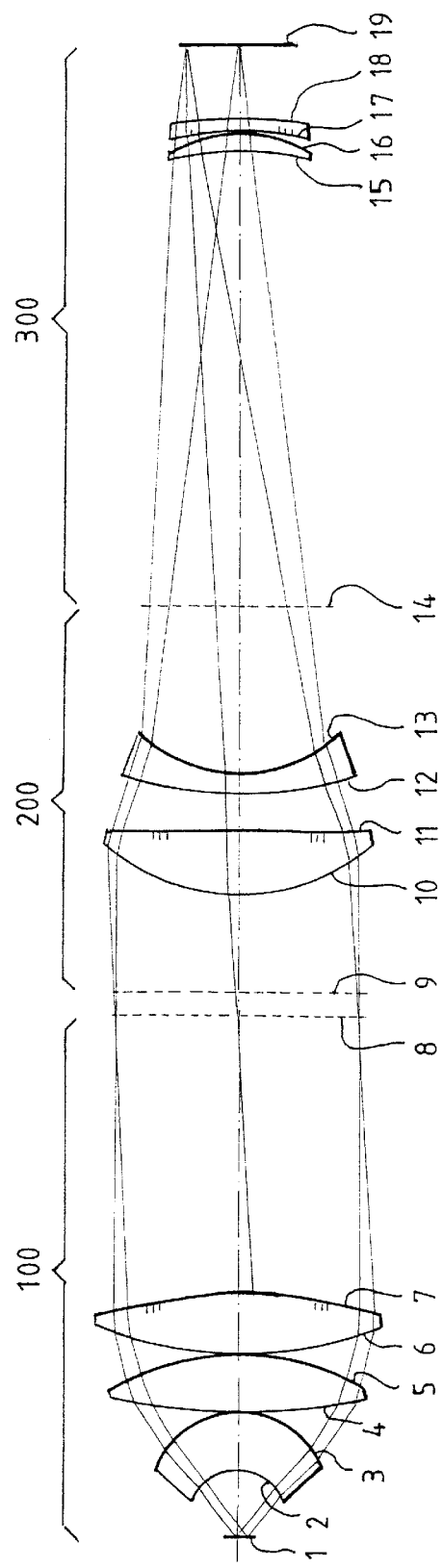
FIG. 1 shows a section of the lenses of a REMA objective with three aspheric elements.

The embodiment example of a REMA objective with the lens section of FIG. 1 has the data of Table 1. It consists of a condenser portion 100, constructed as a partial objective, in front of the aperture diaphragm 8, an intermediate portion 200, and a field lens portion 300. The REMA objective has an image field diameter greater than 80 mm and an image side numerical aperture of greater than 0.10 mm. An aspheric element 7, 11, 17 is provided in each of these portions. Thus the REMA objective has only seven lenses. The planar surfaces 9 and 14 have only a positioning function. A deflecting mirror (240 in FIG. 2) can be arranged in the region of 14.

The description of the aspheric surfaces is according to the formula:

$$p(h) = \{h^2/R + \sqrt{(R^2 - (1+k)h^2)}\} + c1h^4 + \ldots + cn\, h^{2n+2}.$$

Here p is the arrow height, h the distance from the optical axis, R is the vertex radius, k the conical constant and c1 through cn are the aspheric constants. All optical surfaces with a rotationally symmetrical deviation from the best-matched sphere of greater than about 5 micrometers are considered to be aspheric surfaces. The usable asphericities are predominantly of the order of magnitude of 0.1–1 mm (typically, up to 2 mm).

The objective images the object plane 1 in which the reticle masking system is arranged, with an object to image distance of 1200 mm, onto the reticle plane 19. The air spaces at the object plane 1, at the diaphragm plane 8, between the intermediate portion 200 and the field lens portion 300, and also at the reticle plane 19, are generous, so that the portions arranged there—the REMA system 90, correcting elements in the diaphragm plane, a deflecting mirror 240, and the handling system 330 (see FIG. 2) for the reticle—can be installed without causing problems.

The main function of a REMA objective is the imaging of a bright/dark edge (blade of the REMA diaphragm) from the object plane 1 to the reticle plane 19 with an edge course whose brightness values of 5% and 95% are mutually separated by less than 5%, preferably less than 0.5%, of the image field diameter. The embodiment certainly fulfills this function: The separation is 0.4% of the image field diameter of 84.2 mm. With this datum, an integral measure for all image errors in the whole image field is given which is oriented directly to the function of the REMA objective.

This good correction is difficult, since the REMA objective has the considerable light conducting value of 11.4 mm (product of the object field diameter, 19 mm, and the numerical aperture NAO on the object side, 0.6).

The magnification of the REMA objective is 4.444:1.

A further basic function of the REMA objective is that in each point of the image plane, the incident main beam, i.e. the central beam of the incident light cone, differs only slightly from the predetermined main beam of a succeeding projection objective, and in fact by less than 3 mrad. This is of equal importance with the requirement that a predetermined pupil function (see FIG. 3) in the reticle plane must be reproduced with minimal deviations. As shown in FIG. 4, this is satisfactorily attained.

Figure 3:
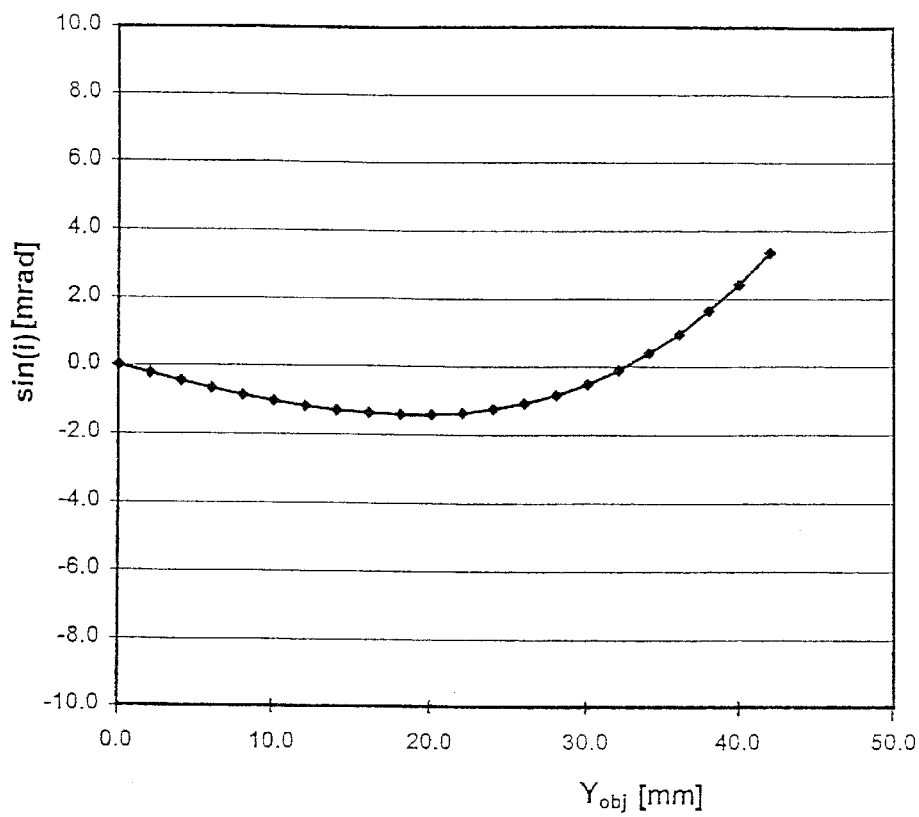
FIG. 3 shows a predetermined pupil function.
Figure 4:
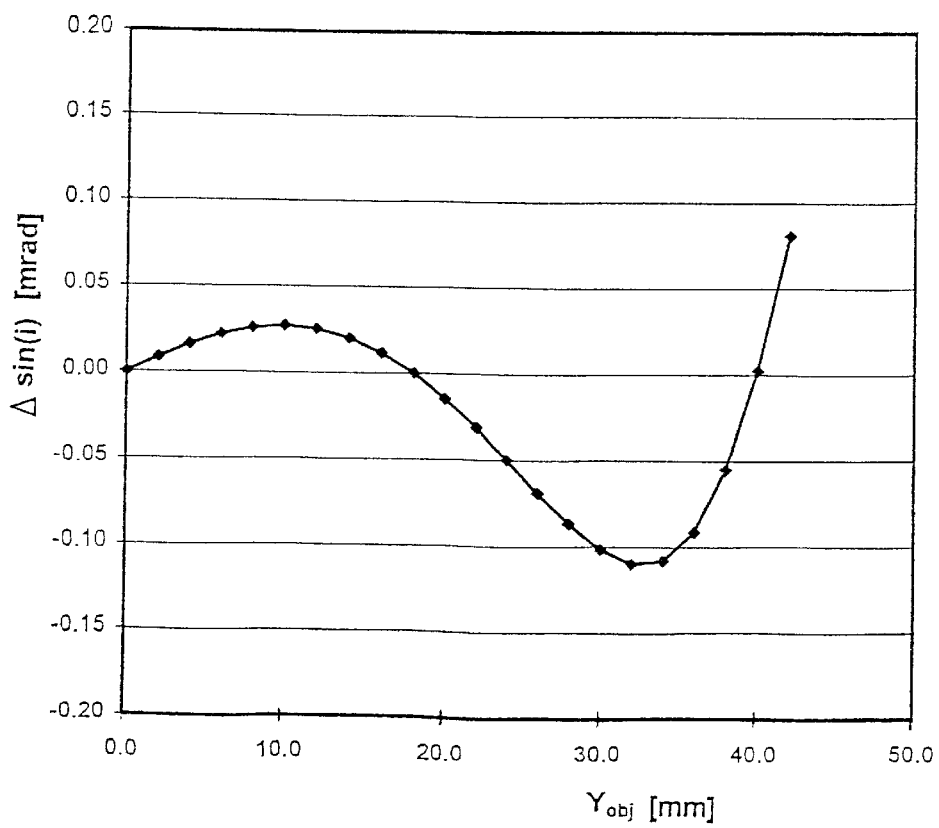
FIG. 4 shows deviations from the pupil function shown in FIG. 3, realized in an example.

In FIG. 3, the sine of the main beam angle, sin(i), is shown as a function of the image height YB in the reticle plane 19, and correspondingly in FIG. 4, the deviation sin(i) which lies in a band of ±0.11 mrad about zero.

The starting point was the matching to double-telecentric projection objectives, so that the REMA objective is likewise telecentric with high accuracy on the image side. It is also absolutely telecentric on the object side.

The design of the field lens group 300 is decisive for matching. In the example, it is reduced to the minimum of two lenses, the collecting lens 15, 16 and the divergent lens 17, 18. The aspheric element then required—as otherwise many spherical elements would be required—is the surface 17. The main beam heights are greater than the marginal ray heights in this region.

One of the surfaces, preferably the last surface 18, can also be made planar, so that it is suitable for carrying a gray filter as a thin layer for controlling the intensity distribution on the reticle.

The condenser part 100 is constructed as a partial objective, the object plane of which is at infinity. The diaphragm lies in the object plane 1 of the whole objective, and the image plane lies in the diaphragm 8 of the whole objective. The marginal rays of the partial objective thus correspond to telecentric main beams of the whole objective, and the main beams of the partial objective correspond to the marginal rays of the whole objective.

The image of this partial objective (condenser portion 100) in the plane of the diaphragm is to be corrected as well as possible, since thereby correcting elements can be arranged in this plane, and a clean diaphragm function is achieved. Accordingly the coma, expressed as transverse deviation, is made smaller in its maximum value than 1%, preferably smaller than 0.2%, of the image field diameter of this partial imaging. In the example, 0.08% is reached. For this purpose, the condenser portion contains at least one hollow surface curved toward the object 1, for which the relative aperture of radius of curvature to the lens diameter lies close to the minimum of 0.5 for the half sphere. In the example, the value at the surface 2 is equal to 0.554. In general, it is to be chosen smaller than 0.65.

By the use of one aspheric element 7 (as in FIG. 1) or two aspheric elements, three (2/3, 4/5, 6/7) or four lenses are sufficient to realize these functions of the condenser part 100.

The intermediate portion 200 likewise has an aspheric element 11. A lens pair 10/11, 12/13 is now sufficient, with the surface 13 fulfilling the following condition: It is a curved surface with $|\sin(i_{edge})| \geq 0.8$ NAO. This surface 13 thus effects a strong refraction in the edge region. For the REMA objective according to the invention, this marginal ray angle is typically greater than 0.6 NAO in any case.

The REMA objective according to the invention thus has all the functions of the REMA objective according to DE 195 48 805.9; the embodiment of the example according to FIG. 1 can be directly substituted for the embodiment example there of FIG. 1. However, the action of the few aspheric elements 7, 11, 17 is drastic.

The condenser part 100 shrinks from 5 to 3 lenses; the intermediate part 200 is now sufficient with only 2–4 lenses, and the number of lenses in the field lens portion 300 is likewise halved to 2. In all, in this embodiment example, only 7 lenses are still present (a maximum of 10 in other embodiments).

The glass path, and accordingly the sum of all glass thicknesses of the lenses on the optical axis, here amounts to only 235 mm, in contrast to 396 mm in the older Application, for an object-image distance 1–19 of 1200 mm in both cases. The glass path is thus reduced by over 40%, and the fraction at the object image distance amounts to only 20%, and even in other embodiments only up to 25–30% of the object image distance.

The transmission of high quality quartz glass at 248 nm is about 99.9 %/cm. The value is reduced by ageing processes (radiation damage, formation of color centers) in the course of operation. With high quality antireflection layers on the glass-air boundary layers, a transmittance of about 99.5% can be attained at 248 nm.

While the REMA objective according to DE 195 48 805.9 reaches a maximum of 84.4% transmission efficiency, the value for the example according to FIG. 1 is after all 91.1%.

This improvement of the transmission efficiency is still more important for systems for shorter wavelengths, for example, 193 nm, since the transmission of quartz (and also of possible alternatives) markedly falls, and the provision of antireflection layers is more difficult. At the same time, even less importance is attached to the material costs, and the laser performance is more expensive and hence the light losses are also more expensive.

Since the present construction can be matched to the situations at other wavelengths, particularly lower wavelengths, taking account of the altered refractive index, the invention is of particular value for this development to lower wavelengths.

Figure 2:
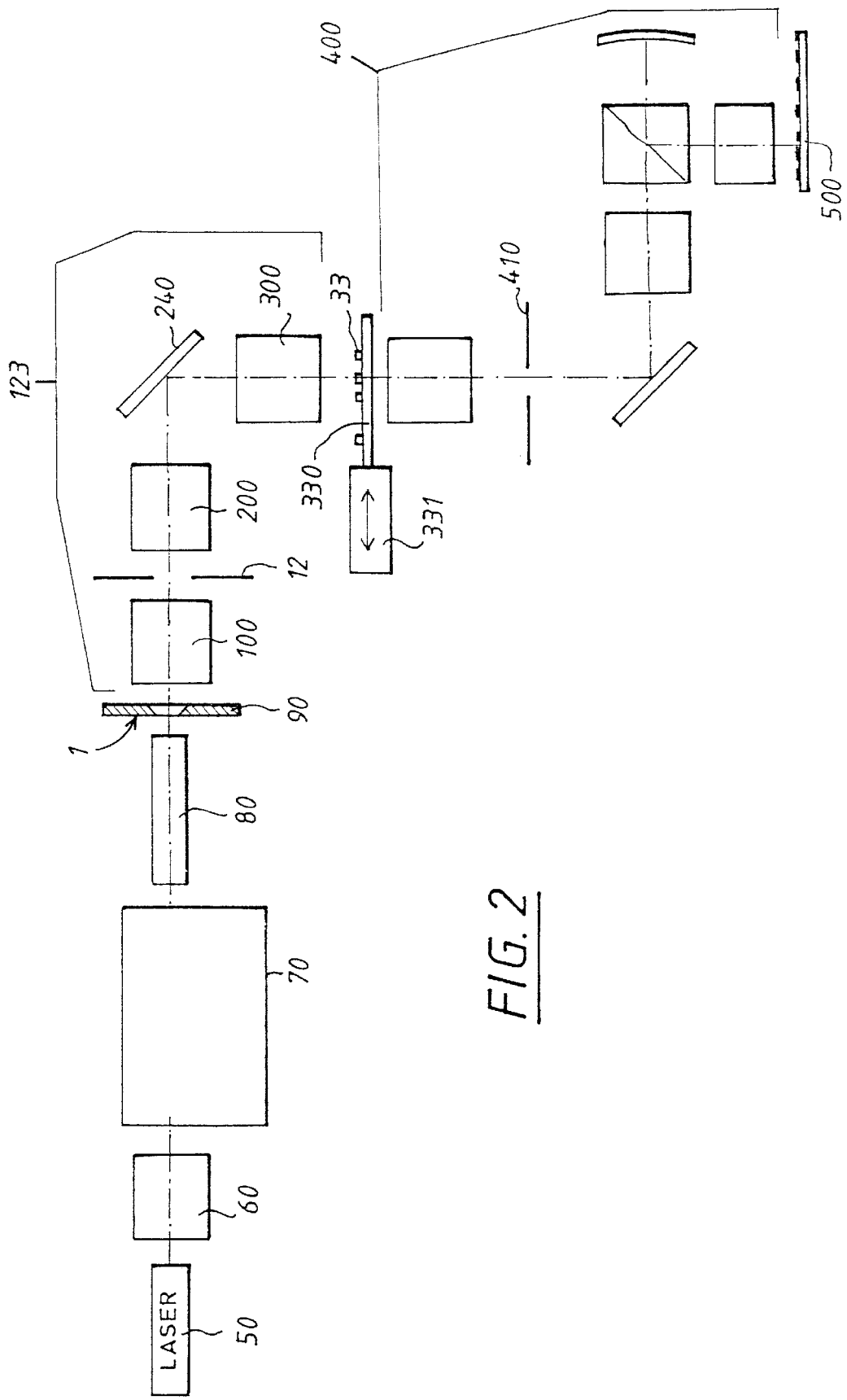
FIG. 2 schematically shows a microlithography projection illumination device.

FIG. 2 shows a schematic overview of the optical part of a complete projection illumination device (wafer stepper), into which the REMA objective 123 according to the invention is integrated.

A KrF excimer laser 50 with a wavelength of 248 nm is used as the light source. A device 60 serves for beam formation and coherence reduction. A zoom axicon objective makes possible the setting of different kinds of illumination according to requirements. The whole arrangement (apart from the features of the REMA objective 123 according to the invention) is known from EP-A 0 687 956 or from DE-U 94 09 744 (both due to the Applicant). The light is coupled into the glass rod 80, which serves for mixing and homogenizing.

Immediately thereto there adjoins the reticle masking system 90, which lies in the object plane 1 of the REMA objective. This consists of the first lens group 100, the pupil plane (diaphragm plane) 14, the second lens group 300, and the image plane 33. The reticle 330 is arranged here, and is precisely positioned by means of the changing and adjusting unit 331. There follows the catadioptric projection objective 400 according to WO 95/32446, with the pupil plane 410. The entry pupil of course lies close to infinity in front of the projection objective, in the embodiment example of Tables 1 and 2. The wafer 500 is arranged in the image plane.

Figure 5:
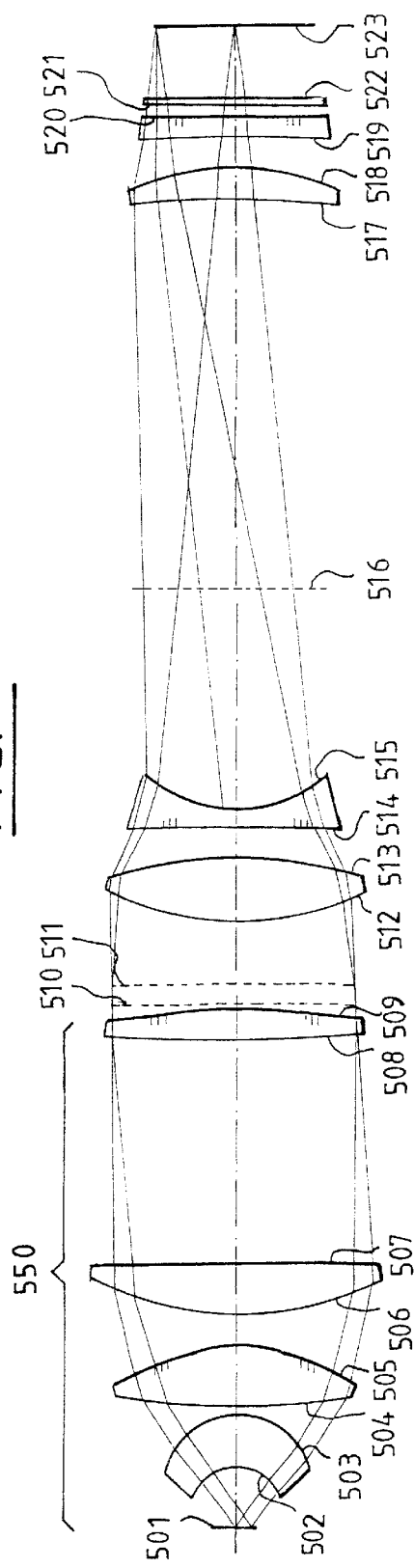
FIG. 5 shows a lens section of another embodiment example with four aspheric elements.

FIG. 5 shows the lens cross section of another embodiment example with aspheric elements 505, 509, and 520, and a total of 18 boundary surfaces of 8 lenses and a flat plate 521, 522. Table 2 gives the dimensions for this. The imaging scale (4.730:1) and image field (diameter 127 mm) do not substantially differ here from the example of FIG. 1. The light conducting value of 16.2 mm is of course greater.

Here also, the number of lenses and the glass path are already drastically reduced, at 22% of the object-image distance, as against a purely spherical design. As a comparison with FIG. 1 shows, the condenser part 550 with 4 lenses here, of which 2 have aspheric elements 505, 509., still has capabilities of optimization. Nevertheless, the improvement over a purely spherical REMA objective is already considerable, with the moderate use of aspheric elements.

TABLE 1

| | Scale : 4.444 : 1 | Wavelength : 248.33 nm | |
| --- | --- | --- | --- |
| | Radius | Thickness | Material |
| 1 | | 55.240 | |
| 2 | −38.258 | 46.424 | Quartz |
| 3 | −66.551 | .633 | |
| 4 | 881.696 | 45.341 | Quartz |
| 5 | −190.791 | .924 | |
| 6 | 374.111 | 47.958 | Quartz |
| 7 | −287.518 | 222.221 | |
| 8 | Diaphragm | 17.900 | |
| 9 | ∞ | 79.903 | |

TABLE 1-continued

| 10 | 164.908 | 52.350 | Quartz |
| --- | --- | --- | --- |
| 11 | −1246.141 | 27.586 | |
| 12 | 280.226 | 19.580 | Quartz |
| 13 | 114.495 | 133.941 | |
| 14 | ∞ | 365.253 | |
| 15 | −216.480 | 12.551 | Quartz |
| 16 | −113.446 | 1.399 | |
| 17 | −329.056 | 10.797 | Quartz |
| 18 | −552.687 | 60.000 | |
| 19 | ∞ | .000 | |

| Surface | Aspheric Constants |
| --- | --- |
| 7 | $K = -.00640071$  $C1 = .347156E-07$  $C2 = .802432E-13$ $C3 = -.769512E-17$  $C4 = .157667E-21$ |
| 11 | $K = +.00104108$  $C1 = .431697E-07$  $C2 = -.564977E-13$ $C3 = -.125201E-16$  $C4 = .486357E-21$ |
| 17 | $K = +.00121471$  $C1 = -.991033E-07$  $C2 = -.130790E-11$ $C3 = -.414621E-14$  $C4 = .200482E-17$  $C5 = -.392671E-21$ |

TABLE 2

| | Scale: 4.730 : 1 | Wavelength : 248.33 nm | |
| --- | --- | --- | --- |
| | Radius | Thickness | Material |
| 501 | ∞ | 49.615 | |
| 502 | −36.076 | 39.343 | Quartz |
| 503 | −58.772 | 7.280 | |
| 504 | 769.933 | 46.491 | Quartz |
| 505 | −154.827 | 24.882 | |
| 506 | 251.853 | 42.379 | Quartz |
| 507 | −5038.206 | 177.092 | |
| 508 | 1206.092 | 26.134 | Quartz |
| 509 | −382.601 | 2.521 | |
| 510 | Diaphragm | 16.000 | |
| 511 | ∞ | 48.808 | |
| 512 | 220.678 | 54.515 | Quartz |
| 513 | −329.344 | 23.787 | |
| 514 | −2544.603 | 12.265 | Quartz |
| 515 | 107.244 | 178.887 | |
| 516 | ∞ | 312.788 | |
| 517 | −634.092 | 24.232 | Quartz |
| 518 | −177.052 | 24.158 | |
| 519 | −1168.238 | 15.641 | Quartz |
| 520 | −3520.690 | 9.182 | |
| 521 | ∞ | 4.000 | Quartz |
| 522 | ∞ | 60.000 | |
| 523 | ∞ | .000 | |

| Surface | Aspheric Constants |
| --- | --- |
| 505 | $K = -.11512040$  $C1 = .36489383E-07$  $C2 = .16169445E-11$ $C3 = -.70228033E-16$  $C4 = .36695356E-20$ |
| 509 | $K = -.01464591$  $C1 = .37060030E-07$  $C2 = .92577260E-12$ $C3 = -.10037407E-16$  $C4 = .29843433E-20$ |
| 514 | $K = +.00003903$  $C1 = -.13705523E-08$  $C2 = -.90824867E-12$ $C3 = .81297785E-16$  $C4 = -.56418498E-20$ |
| 520 | $K = -.000150010$  $C1 = .17085177E-07$  $C2 = .18373060E-10$ $C3 = -.49871601E-14$  $C4 = .61193181E-18$ $C5 = -.23186913E-22$ |

What is claimed is:

1. A REMA objective with an enlargement of three times through eight times, a light-conducting value greater than 10 mm, in which imaging of a bright/dark edge from an object plane onto a reticle plane results in an edge course whose brightness values of 5% and 95% are mutually separated by less than 2% of the image field diameter, including no more than 10 lenses, including 1 to 5, aspheric surfaces.

2. The REMA objective according to claim 1, in which said brightness values are mutually separated by less than 0.5% of the image field diameter.

3. The REMA objective according to claim 1, in which said lenses include three to four aspheric surfaces.

4. The REMA objective according to claim 1, in which said lenses have a glass path that amounts to a maximum of 30% of the distance of said object plane to said reticle plane.

5. The REMA objective according to claim 4, in which said lenses have a glass path that amounts to a maximum of 25% of the distance of said object plane to said reticle plane.

6. The REMA objective according to claim 1, comprising at least one optical surface having the greatest amount of the sine of the angle of incidence relative to the surface normal of a marginal ray in air ($|\sin (i_{edge})|$) greater than 0.6 times the numerical aperture (NAO) on the object side.

7. The REMA objective according to claim 6, in which said greatest amount of said sine of the angle of incidence is greater than 0.8 times said numerical aperture (NAO) on the object side.

8. The REMA objective according to claim 1, comprising a partial objective that produces a pupil plane that is corrected with respect to coma.

9. The REMA objective according to claim 8, in which said partial objective comprises at least one concave surface that is curved toward said object plane, and at which the relative aperture of the radius of curvature to the lens diameter is smaller than 0.65.

10. The REMA objective according to claim 1, used in a microlithography projection illumination device having a reticle mask arranged at an exit of a glass rod.

11. The REMA objective according to claim 1, used in a microlithography projection illumination device having a reducing catadioptric projection objective.

12. The REMA objective according to claim 1, in which said lenses comprise a condenser portion constructed as a forward partial objective with an image plane that lies at infinity and a diaphragm that lies in said object plane of the whole REMA objective, an intermediate portion, and a field lens portion.

13. The REMA objective according to claim 1, that reproduces a predetermined pupil function with values of sin(i) in the range of ±10 mrad with deviations of less than ±1 mrad.

14. The REMA objective according to claim 13, in which said deviations are less than +0.3 mrad.

15. A REMA objective that images an object plane of the entire REMA objective, which object plane lies at a finite distance from a reticle plane, comprising:
  a condenser portion constructed as a front partial objective, the image plane of which lies at infinity, and the diaphragm of which lies in said object plane,
  an intermediate portion, and
  a field lens portion,
  in which said condenser portion, said intermediate portion, and said field lens portion each contain one to two aspheric lens surfaces, a total of no more than five aspheric surfaces and a total of no more than 10 lenses.

16. The REMA objective according to claim 15, having an enlargement of three to eight times.

17. The REMA objective according to claim 15, having an image field diameter greater than 80 mm.

18. The REMA objective according to claim 15, having an image side numerical aperture of greater than 0.10.

19. The REMA objective according to claim 15, having a light conducting value greater than 10 mm.

20. The REMA objective according to claim 15, in which imaging of a bright/dark edge from said object plane onto said reticle plane results in an edge course whose brightness values of 5% and 95% are mutually separated by less than 2% of the image field diameter.

21. The REMA objective according to claim 20, in which said brightness values are mutually separated by less than 0.5% of the image field diameter.

22. The REMA objective according to claim 15, in which said condenser portion, said intermediate portion, and said field lens portion include a total of no more than four aspheric surfaces.

23. The REMA objective according to claim 15, having a deflective mirror between said intermediate portion and said field lens portion.

24. The REMA objective according to claim 15, being telecentric on the object side.

25. The REMA objective according to claim 15, comprising a collecting lens and a divergent lens in said field portion.

26. The REMA objective according to claim 15, comprising a lens with positive optical power and a lens with negative optical power in said intermediate portion.

27. The REMA objective according to claim 15, wherein said intermediate portion consists of a lens with positive optical power and a lens with negative optical power.

28. A microlithography projection illumination device, comprising:
  an illuminator containing an enlarging REMA objective, and
  a reducing projection objective, in which:
    a pupil plane of said REMA objective is imaged in a pupil plane of said projection objective,
    in each point of a reticle plane an incident main beam of said REMA objective deviates less than 3 mrad from a main beam of said projection objective, and
    said REMA objective has a maximum of 10 lenses with a maximum of 5 aspheric surfaces.

29. The microlitography projection illumination device according to claim 28, having a maximum of 4 aspheric surfaces.

* * * * *